(12) United States Patent
Hwang (10) Patent No.: US 11,017,984 B2
(45) Date of Patent: May 25, 2021

(54) CERAMIC COATED QUARTZ LID FOR PROCESSING CHAMBER

(71) Applicant: Applied Materials, Inc., Santa Clara, CA (US)

(72) Inventor: Bernard L. Hwang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 704 days.

(21) Appl. No.: 15/461,172

(22) Filed: Mar. 16, 2017

(65) Prior Publication Data

US 2017/0314124 A1    Nov. 2, 2017

Related U.S. Application Data

(60) Provisional application No. 62/328,686, filed on Apr. 28, 2016.

(51) Int. Cl.
*H01J 37/32* (2006.01)
*C23C 16/44* (2006.01)
(Continued)

(52) U.S. Cl.
CPC ........ *H01J 37/32119* (2013.01); *C23C 16/40* (2013.01); *C23C 16/405* (2013.01);
(Continued)

(58) Field of Classification Search
CPC ... C23C 16/40; C23C 16/405; C23C 16/4404; C23C 16/4409; C23C 16/45591;
(Continued)

(56) References Cited

U.S. PATENT DOCUMENTS

| 5,614,055 A | 3/1997 | Fairbairn et al. |
| 5,865,896 A | 2/1999 | Nowak et al. |

(Continued)

FOREIGN PATENT DOCUMENTS

| CN | 103069543 A | 4/2013 |
| TW | 201334020 A | 8/2013 |
| TW | 201350209 A | 12/2013 |

OTHER PUBLICATIONS

Taiwan Office Action for Application No. 106113904 dated Jul. 23, 2019.

(Continued)

*Primary Examiner* — Benjamin Kendall
(74) *Attorney, Agent, or Firm* — Patterson + Sheridan, LLP (57) ABSTRACT

Implementations of the present disclosure include methods and apparatuses utilized to reduce particle generation within a processing chamber. In one implementation, a lid for a substrate processing chamber is provided. The lid includes a cover member having a first surface and a second surface opposite the first surface, a central opening through the cover member, wherein an inner profile of the central opening includes a first section having a first diameter, a second section having a second diameter, and a third section having a third diameter, wherein the second diameter is between the first diameter and the third diameter, and the first diameter increases from the second section toward the first surface of the cover member, and a trench formed along a closed path in the first surface and having a recess formed in an inner surface of the trench.

20 Claims, 5 Drawing Sheets

(51) Int. Cl.
*C23C 16/455* (2006.01)
*C23C 16/40* (2006.01)
*C23C 16/458* (2006.01)
*H01L 21/67* (2006.01)

(52) U.S. Cl.
CPC ........ *C23C 16/4404* (2013.01); *C23C 16/458* (2013.01); *C23C 16/4585* (2013.01); *C23C 16/45591* (2013.01); *H01J 37/32495* (2013.01); *H01L 21/67063* (2013.01)

(58) Field of Classification Search
CPC .. C23C 16/458; C23C 16/4585; H01J 37/321; H01J 37/32119; H01J 37/32238; H01J 37/32477; H01J 37/32495; H01J 37/32807; H01L 21/67063
See application file for complete search history.

(56) References Cited

U.S. PATENT DOCUMENTS

| | | | |
|---|---|---|---|
| 6,224,638 | B1 | 5/2001 | Jevtic et al. |
| 6,245,192 | B1 | 6/2001 | Dhindsa et al. |
| 6,286,451 | B1* | 9/2001 | Ishikawa ............ C23C 16/4405 |
| 7,685,965 | B1 | 3/2010 | Hao et al. |
| 8,623,527 | B2 | 1/2014 | Sun et al. |
| 9,162,236 | B2 | 10/2015 | Nangoy et al. |
| 9,583,369 | B2 | 2/2017 | Sun et al. |
| 9,805,959 | B2 | 10/2017 | Matsumoto |
| 9,812,341 | B2 | 11/2017 | Sun et al. |
| 9,869,012 | B2 | 1/2018 | Sun et al. |
| 10,438,819 | B2 | 10/2019 | Matsumoto |
| 2004/0134427 | A1* | 7/2004 | Derderian ........... C23C 16/4404 118/715 |
| 2006/0065635 | A1 | 3/2006 | Derderian et al. |
| 2007/0113978 | A1 | 5/2007 | Ishii et al. |
| 2007/0163502 | A1 | 7/2007 | Nozawa et al. |
| 2007/0256786 | A1* | 11/2007 | Zhou ................ H01J 37/32477 156/345.34 |
| 2008/0282979 | A1* | 11/2008 | Chen ................. H01J 37/32192 118/722 |
| 2009/0194236 | A1 | 8/2009 | Ono et al. |
| 2009/0314207 | A1* | 12/2009 | Endoh ................... C01B 33/035 118/723 R |
| 2011/0073564 | A1* | 3/2011 | Nangoy ................ H01J 37/321 216/67 |
| 2011/0162800 | A1 | 7/2011 | Noorbakhsh et al. |
| 2013/0102156 | A1 | 4/2013 | Stevenson et al. |
| 2013/0109159 | A1 | 5/2013 | Carlson |
| 2013/0284700 | A1* | 10/2013 | Nangoy ................. B05B 1/185 216/58 |
| 2014/0262034 | A1* | 9/2014 | Ishibashi ........... C23C 16/45563 156/345.29 |
| 2014/0363596 | A1 | 12/2014 | Sun et al. |
| 2015/0021324 | A1* | 1/2015 | Sun ........................... C23C 4/11 220/200 |
| 2015/0087162 | A1* | 3/2015 | Matsumoto ....... H01J 37/32192 438/798 |
| 2017/0032988 | A1* | 2/2017 | Park .................. H01J 37/32009 |
| 2017/0365444 | A1* | 12/2017 | Kim .................. H01J 37/32119 |
| 2018/0100228 | A1 | 4/2018 | Sun et al. |

OTHER PUBLICATIONS

Chinese Office Action dated Mar. 2, 2020 for Application No. 201710294635.0.
Chinese Office Action dated Jun. 11, 2020 for Application No. 201710620229.9.
Chinese Office Actio dated Nov. 20, 2020 for Application No. 201710294635.0.
CN Office Action dated Dec. 29, 2020 for Application No. 201710620229.9.

\* cited by examiner

CERAMIC COATED QUARTZ LID FOR PROCESSING CHAMBER

CROSS-REFERENCE TO RELATED APPLICATIONS

This application claims priority to U.S. provisional patent application Ser. No. 62/328,686, filed Apr. 28, 2016, which is herein incorporated by reference.

BACKGROUND

Field

Implementations of the present disclosure generally relate to a semiconductor processing systems. More specifically, implementations of the disclosure relates to a lid for use in a semiconductor processing system.

Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. to sub-micron dimensions), the importance of reducing presence of contaminant has increased since such contaminant may lead to the formation of defects during the semiconductor fabrication process. For example, in an etching process, by-products, e.g., polymers that may be generated during the etching process, may become a source of particulates, contaminating integrated circuits and structures formed on semiconductor substrates.

In the field of semiconductor material processing, semiconductor material processing apparatuses including vacuum processing chambers are used, for example for etching and chemical vapor deposition (CVD) of various materials on substrates. Some of these processes utilize corrosive and erosive process gases and plasma, such as hydrogen plasma, in such processing chambers. There is a need to minimize particle contamination of substrates processed in such processing chambers. There is also a need for plasma-exposed components of such apparatuses to be resistant to chemical attack when exposed to such gases and plasma.

SUMMARY

Implementations of the present disclosure include methods and apparatuses utilized to reduce particle generation within a processing chamber. In one implementation, a lid for a substrate processing chamber is provided. The lid includes a cover member having a first surface and a second surface opposite the first surface, a central opening through the cover member, wherein an inner profile of the central opening includes a first section having a first diameter, a second section having a second diameter, and a third section having a third diameter, wherein the second diameter is between the first diameter and the third diameter, and the first diameter increases from the second section toward the first surface of the cover member, and a trench formed along a closed path in the first surface and having a recess formed in an inner surface of the trench.

In another implementation, a processing chamber is provided. The processing chamber includes a body, a substrate support assembly disposed within the body, and a lid covering the body. The lid includes a plate having a first surface and a second surface opposite the first surface, a central opening through the plate, wherein a portion of the central opening has an inner diameter that increases toward the first surface, and a trench formed in the first surface. The processing chamber also includes a gas coupling insert disposed within central opening and having a tapered flange shaped to match the inner diameter of the central opening.

In yet another implementation, a method for reducing particle generation within a processing chamber is provided. The method includes providing a chamber lid having a top surface and a bottom surface that is parallel to the top surface, wherein the chamber lid has a central opening, and an upper portion of the central opening has an inner diameter gradually increased towards the top surface, bead blasting the bottom surface of the chamber lid, depositing a coating on the bottom surface of the chamber lid, wherein the coating comprising an yttrium oxide containing ceramic or yttrium containing oxide, disposing a spacer ring within the central opening, wherein the spacer ring has an outer surface shaped to match the inner diameter of the central opening, and disposing a gas coupling insert on the spacer ring, wherein the gas coupling insert is a cylindrical hollow body having a plurality of axial through holes formed in a bottom of the gas coupling insert, and the gas coupling insert has a conical flange extending outwardly from an outer surface of the cylindrical hollow body, and wherein the conical flange is shaped to match the inner diameter of the central opening.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings.

It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures.

DETAILED DESCRIPTION

Figure 1:
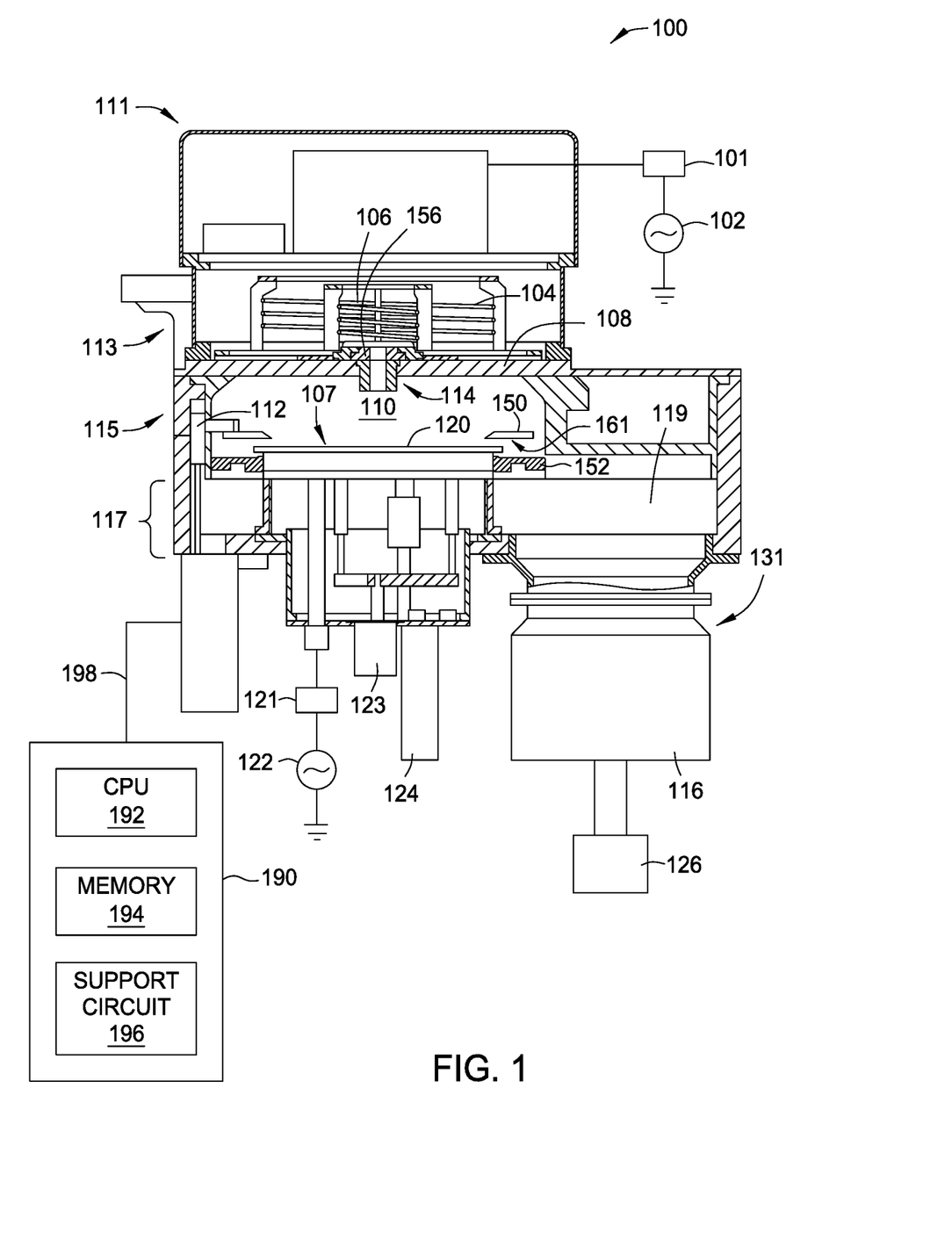
FIG. 1 depicts a schematic cross-sectional view of a processing chamber according to one implementation of the present disclosure.

FIG. 1 depicts a schematic cross-sectional view of a processing chamber 100 according to one implementation of the present disclosure. The processing chamber 100 may be a plasma process chamber, such as an inductively coupled plasma (ICP) processing chamber or a DPN HD processing chamber available from Applied Materials, Inc., Santa Clara, Calif. The processing chamber 100 may be a fully automated semiconductor plasma processing chamber of the kind which is typically employed as part of a multi-chamber, modular system (not shown). As shown in FIG. 1, the processing chamber 100 includes a body 115, a lid 108, and a substrate support assembly 107 disposed within the body 115. The body 115, the lid 108 and the substrate support assembly 107 substantially define a processing volume 110. The processing volume 110 may be configured to accommodate a substrate 120 having a nominal diameter size up to 12 inch (300 mm), 18 inch (450 mm), or other diameter.

The processing chamber 100 includes a plasma power source 102 and a matching network 101. The plasma power source 102 and the matching network 101 are in communication with a power generating apparatus. The power generating apparatus may be housed within a first enclosure 111 disposed on the body 115. The plasma source power 102 and matching network 101 operate at a frequency which is typically in the range of about 12 MHz to about 13.5 MHz. If desired, the plasma power source 102 may be operated at a frequency up to 60 MHz. In various implementations, the plasma source power 102 may be operated at a power in the range from about 0.1 kW to about 5 kW. Inductive coils 104, 106 may be located within a second enclosure 113 disposed between the body 115 and the first enclosure 111. When energized by the plasma power source 102, the inductive coils 104, 106 generate an RF field in the processing volume 110 that can form a plasma from a gas in the processing volume 110. The plasma can then be used to perform a plasma process on the substrate 120.

The lid 108 includes a cover member, which may be a plate, having a central opening adapted to receive a gas coupling insert 114. The gas coupling insert 114 may include a cylindrical hollow body having a plurality of axial through holes (shown in FIG. 4) formed in the bottom of the cylindrical hollow body. A gas connector 156 may be disposed on the lid 108. A processing gas (not shown) is introduced into the gas connector 156 to through holes of the gas coupling insert 114, which provide uniform controlled gas flow distribution in the processing volume 110. Further details of the lid 108 will be discussed below with respect to FIGS. 2A to 2C.

The processing volume 110 present within the body 115 is in fluid communication with a non-processing volume 117. The non-processing volume 117 is in fluid communication with a throttle valve 119. The throttle valve 119 communicates with an exhaust system 131 that may include a turbo pump 116 and a roughing pump 126, all in fluid communication with the throttle valve 119. Exhaust gases may flow from the throttle valve 119 sequentially through the turbo pump 116 and the roughing pump 126. In operation, plasma source gas is provided to the processing volume 110 and processing by-products are exhausted from the processing volume 110 through the throttle valve 119 and the exhaust system 131.

A substrate entry port 112 is formed in the body 115 to facilitate entry and removal of the substrate 120 from the processing chamber 100. The substrate support assembly 107 is disposed within the body 115 to support the substrate 120 during processing. The substrate support assembly 107 may be a mechanical or electrostatic chuck with at least a portion of the substrate support assembly 107 being electrically conductive and capable of serving as a process bias electrode. A fluid conduit 124 may be coupled to the substrate support assembly 107 to maintain the temperature thereof at a desired range. Substrates disposed on the substrate support assembly 107 may be raised and lowered by means of a plurality of lift pins (not shown) to facilitate transfer of the substrate onto and off of the substrate support assembly 107.

A shadow ring 150 may be disposed adjacent to an edge ring 152 circumscribing a periphery region of the substrate support assembly 107. The edge ring 152 is shaped in a manner to define a cavity 161 between the edge ring 152 and the shadow ring 150. The cavity 161 defines a constrained flow path that allows plasma to flow in a direction away from substrate bevel and be pumped out of the processing chamber through the cavity 161 to the roughing pump 126, rather than accumulating and forming a residual film layer on the substrate bevel or backside.

The controller 190 may include a central processing unit (CPU) 192, a memory 194, and a support circuit 196 utilized to control the process sequence and regulate the gas flows and plasma process performed in the processing chamber 100. The CPU 192 may be of any form of a general purpose computer processor that may be used in an industrial setting. The software routines such as the etching process described below can be stored in the memory 194, such as random access memory, read only memory, floppy, or hard disk drive, or other form of digital storage. The support circuit 196 is conventionally coupled to the CPU 192 and may include cache, clock circuits, input/output systems, power supplies, and the like. Bi-directional communications between the controller 190 and the various components of the processing chamber 100 are handled through numerous signal cables collectively referred to as signal buses 198, some of which are illustrated in FIG. 1.

The substrate 120 may be biased by providing RF power from a RF bias power source 122 through a matching network 121 coupled to the substrate support assembly 107. RF power provided by the RF bias power source 122 may be within the range of 100 kHz to 13.56 MHz, such as within the range of 100 kHz to 2 MHz. The plasma power source 102 and the substrate RF bias power source 122 are independently controlled by the controller 190.

Figure 2A:
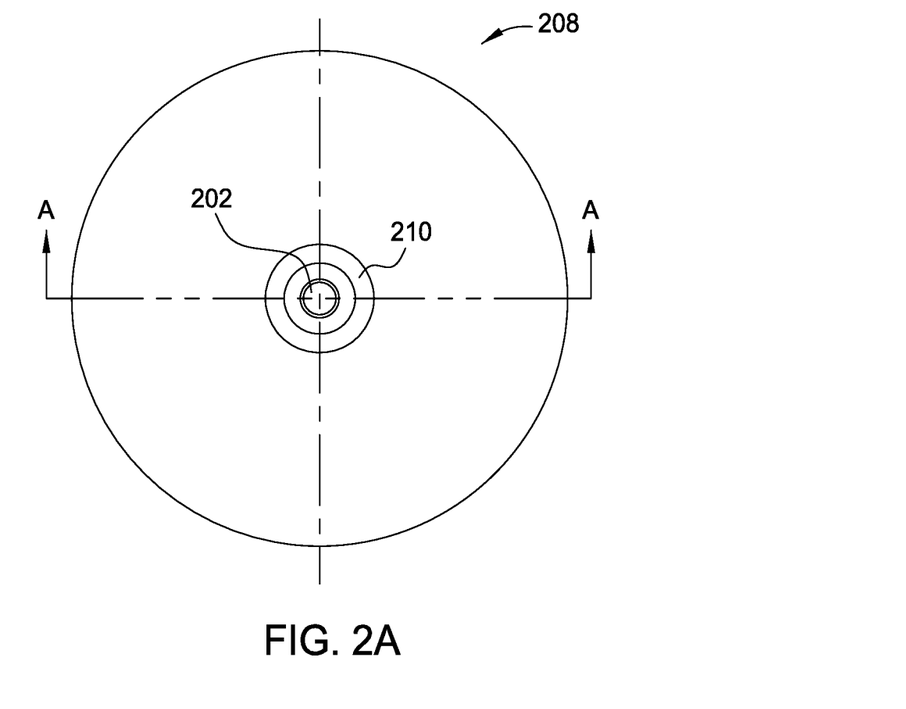
FIG. 2A depicts a top view of a lid according to one implementation of the present disclosure.
Figure 2B:
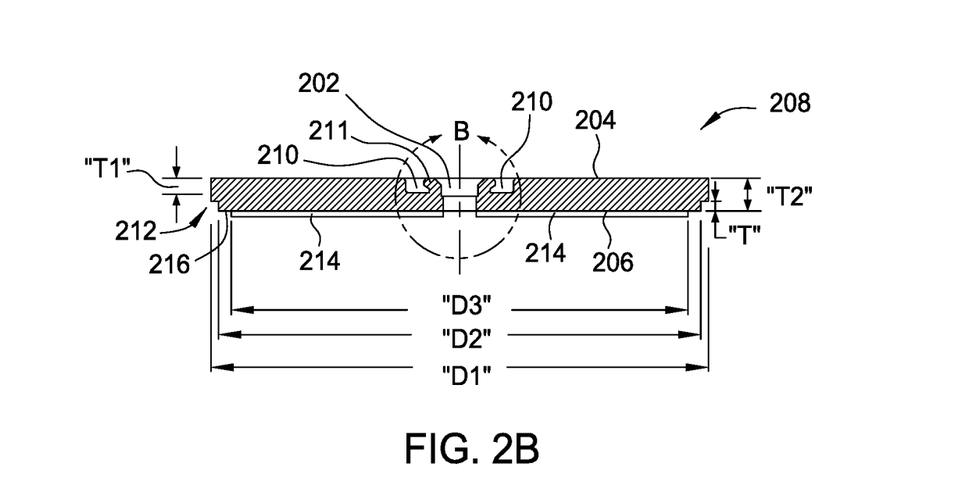
FIG. 2B depicts a schematic cross-sectional view of the lid taken along line A-A of FIG. 2A.

FIG. 2A depicts a top view of a chamber lid 208 according to one implementation of the present disclosure. The lid 208 may be used in place of the lid 108 depicted in FIG. 1. FIG. 2B depicts a schematic cross-sectional view of the lid 208 taken along line A-A of FIG. 2A. The lid 208 is sealingly disposed above the body 115 of FIG. 1 to provide an enclosed environment inside the processing chamber 100 for vacuum processing. The lid 208 may be removably coupled to a portion of the body 115. The lid 208 may be shaped as a plate as shown in FIG. 2B, or a dome, depending on the processing chamber 100 or the process for which the processing chamber 100 is configured. As shown in FIG. 2A, the lid 208 is a flat circular plate having a central opening 202. A trench 210 may form along a closed path in the first surface 204 of the lid 208. As will be discussed in more detail in FIG. 4, the trench 210 may be shaped to form a flange 211 that is sized for securing an upper clamp 420 and a pair of lower clamps 422a, 422b. The upper clamp 420 and the lower clamps 422a, 422b together secure the gas connector 156 and the gas coupling insert 114 in place with respective to the lid 208.

Referring to FIG. 2B, the lid 208 has a first surface 204, which may be planar, and a second surface 206, which may also be planar. The second surface 206 is opposite the first surface 204. The first surface 204 has a diameter "D1" and the second surface 206 has a diameter "D2". For a 300 mm substrate, the diameter "D1" may be about 19 inches to about 24 inches, and the diameter "D2" may be about 18 inches to about 23 inches. The lid 208 may have a notch 212 formed in the periphery of the lid 208 so that the diameter "D1" of the first surface 204 is larger than the diameter "D2" of the second surface 206. The notch 212 may have a thickness "T" and the trench 210 may have a depth "T1" that is larger than the thickness "T". The depth "T1" of the trench 210 is shorter than the thickness "T2" of the lid 208. The depth "T1" may be about 0.7 inches to about 1.2 inches. The depth "T2" may be about 1 inch to about 1.5 inches.

The lid 208 may be formed of various transparent materials such as quartz or sapphire. In one implementation, the lid 208 is made of a flame polished quartz and may have an average surface roughness average of between about 2 Angstroms and about 150 Angstroms, for example between about 5 Angstroms and about 50 Angstroms. Alternatively, only the second surface 206 of the lid 208 is flamed polished. In another implementation, the lid 208 is made of a non-flame polished quartz. In either case, the lid 208 may be coated with a ceramic coating 214, such as an yttrium oxide containing ceramic or other yttrium containing oxide, in order to protect the lid 208 from hydrogen containing plasma, such as a plasma formed from $H_2$ gas, during processing of the substrate. The ceramic coating 214 may be coated on the second surface 206 of the lid 208. If desired, the ceramic coating may be applied to the exposed surfaces of the lid 208, or to all surfaces of the lid 208.

In one implementation, the lid 208 is entirely coated with the ceramic coating. In one implementation, the ceramic coating 214 is uniformly coated on the second surface 206 and has a diameter "D3". The diameter "D3" may be about 17 inches to about 22 inches. The diameter "D3" of the ceramic coating 214 is slightly less than the diameter "D2" of the second surface 206, leaving the peripheral region 216 around the second surface 206 free from the ceramic coating 214 so that the ceramic coating 214 does not interfere with other chamber components that touch the peripheral region 216 of the second surface 206. In one implementation, the peripheral region 216 is about 1 inch wide measuring from the edge of the second surface 206. The ceramic coating 214 does not reach into the central opening 202.

The ceramic coating 214 may be applied using a thermal spraying technique, for example, a plasma spraying technique. Thermal spraying techniques may melt, vaporize, ionize, or otherwise deliver materials (e.g., ceramic powders) in a spray form, and spray the materials onto the second surface 206 of the lid 208 in a way that promotes formation of a coating on the second surface 206 through mechanical, thermal, or chemical adhesion processes. The thermally sprayed or plasma sprayed ceramic coating may have a thickness of about 0.001 inches to about 0.100 inches, such as about 0.005 inches to about 0.050 inches, for example about 0.010 inch±0.001 inch. In case where the lid 208 is made of a non-flame polished quartz, the second surface 206 may be roughened, for example by bead blasting, prior to coating. Roughening of the second surface 206 may serve to activate the second surface 206 to promote better adhesion of the ceramic coating 214 onto the lid 208. In case where the lid 208 is made of a flame polished quartz, the second surface 206 may be roughened by bead blasting after the ceramic coating is deposited on the second surface 206 to enhance the adhesion of the ceramic coating onto the second surface 206.

In one implementation, which may be combined with any other implementations disclosed in the present disclosure, the ceramic coating 214 is a high performance material (HPM) that may be produced from raw ceramic powders of $Y_2O_3$, $Al_2O_3$, and $ZrO_2$. In one exemplary example, the ceramic coating 214 may be formed of $Y_2O_3$ in a range between about 45 mol. % and about 100 mol. % $ZrO_2$ in a range from about 0 mol. % and about 55 mol. %, and $Al_2O_3$ in a range from about 0 mol. % to about 10 mol. %. In one exemplary example, the ceramic coating 214 may be formed of $Y_2O_3$ in a range between about 30 mol. % and about 60 mol. % $ZrO_2$ in a range from about 0 mol. % and about 20 mol. %, and $Al_2O_3$ in a range from about 30 mol. % to about 60 mol. %.

In one implementation, which may be combined with any other implementations disclosed in the present disclosure, the ceramic coating 214 is composed of at least a compound $Y_xZr_yAl_zO$. The ceramic coating 214 may have a graded composition across its thickness. In one exemplary example, the ceramic coating 214 may contain $Y_2O_3$ having a molar concentration gradually changing from about 40 mol.% to about 85 mol.%, for example about 50 mol.% to about 75 mol.%, $ZrO_2$ having a molar concentration gradually changing from 5 mol.% to about 60 mol.%, for example about 10 mol.% to about 30 mol.%, and $Al_2O_3$ having a molar concentration gradually changing from 5 mol.% to about 50 mol.%, for example about 10 mol.% to about 30 mol.%. In another exemplary example, the ceramic coating 214 may contain $Y_2O_3$ having a molar concentration gradually changing from about 55 mol.% to about 65 mol.%, $ZrO_2$ having a molar concentration gradually changing from 10 mol.% to about 25 mol.%, and $Al_2O_3$ having a molar concentration gradually changing from 10 mol.% to about 20 mol.%. In yet another exemplary example, the ceramic coating 214 may contain $Y_2O_3$ having a molar concentration gradually changing from about 55 mol.% to about 65 mol.%, $ZrO_2$ having a molar concentration gradually changing from 20 mol.% to about 25 mol.%, and $Al_2O_3$ having a molar concentration gradually changing from 5 mol.% to about 10 mol.%.

In one implementation, which may be combined with any other implementations disclosed in the present disclosure, the ceramic coating 214 is a HPM material composed of a compound $Y_4Al_2O_9$ and a solid solution $Y_{2-x}Zr_xO_3$ ($Y_2O_3$—$ZrO_2$ solid solution). In one exemplary example, the HPM ceramic contains 77% $Y_2O_3$, 15% $ZrO_2$ and 8% $Al_2O_3$. In another exemplary example, the HPM ceramic contains 63% $Y_2O_3$, 23% $ZrO_2$ and 14% $Al_2O_3$. In still another exemplary example, the HPM ceramic contains 55% $Y_2O_3$, 20% $ZrO_2$ and 25% $Al_2O_3$. Relative percentages may be in molar ratios. For example, the HPM ceramic may contain 77 mol % $Y_2O_3$, 15 mol % $ZrO_2$ and 8 mol % $Al_2O_3$. Other distributions of these ceramic powders may also be used for the HPM material. The ceramic coating 214 provide high erosion resistance under $H_2$ chemistry, low porosity, and significant improvement in corrosion resistance. It is contemplated that the percentage or molar ratios described herein may vary depending upon the application.

Figure 2C:
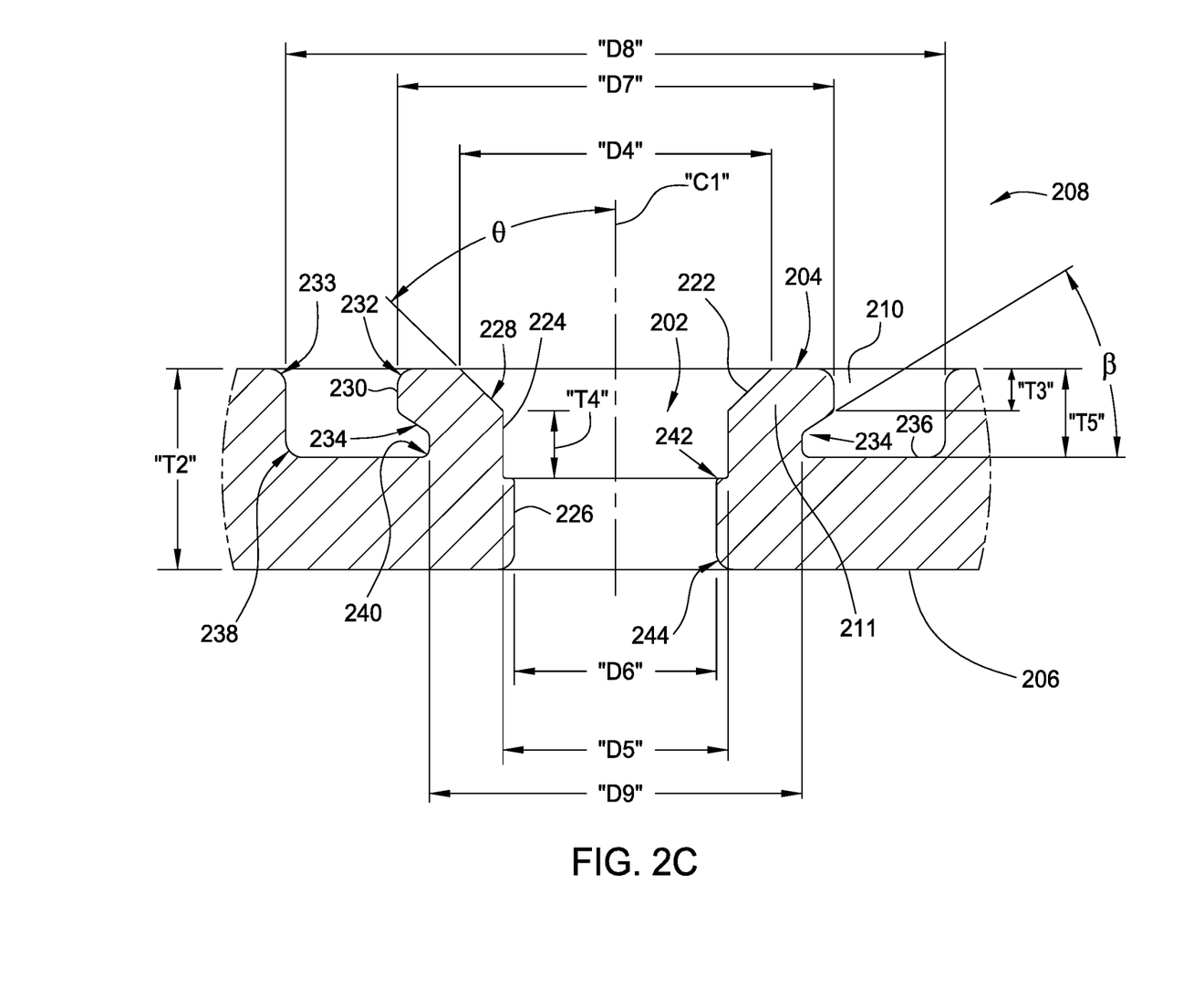
FIG. 2C is an enlarged cross-sectional view of circle "B" in FIG. 2B.

FIG. 2C is an enlarged cross-sectional view of circle "B" in FIG. 2B. As shown in FIG. 2C, the inner profile of the central opening 202 may be divided into three sections with different inner diameters. That is, the upper section 222, the bottom section 226, and the middle section 224 sandwiched between the upper section 222 and the bottom section 226. The upper section 222 is flared out upwardly so that the inner surface 228 of the upper section 222 is extending along a direction that is at an angle "θ" with respect to a central axis "C1" vertically passing through the lid 208. The angle "θ" may be between about 30° and about 60°, for example about 45°. The lid 208 forms a flange 211 around the upper section 222 of the central opening 202 as a result of this flared-out profile. As will be discussed in more detail below with respect to FIG. 4, the upper section 222 is shaped to match a conical or tapered flange 414 of a gas coupling insert 114.

The upper section 222 has an inner diameter "D4" that gradually increases from an inner diameter "D5" of the middle section 224 toward the first surface 204 of the lid 208. The bottom section 226 may have an inner diameter "D6" that is relatively smaller than the inner diameter "D5" of the middle section 224. For a 300 mm substrate, the inner diameter "D4" may be about 1.7 inches to about 2.5 inches. The inner diameter "D5" may be about 1.4 inches to about 1.8 inches. The inner diameter "D6" may be about 1.2 inches to about 1.6 inches. The upper section 222 may have a depth "T3" while the middle section 224 may have a depth "T4" that is larger or smaller than the depth "T3". The depth "T3" may be about 0.15 inches to about 0.4 inches. The depth "T4" may be about 0.3 inches to 0.5 inches. The corners 242, 244 of the bottom section 226 may be rounded.

The trench 210 is formed along a closed path in the first surface 204 of the lid 208. The trench 210 may be annular or any other closed loop pattern. The trench 210 may have an inner surface 230 that is parallel to the central axis "C1". The trench 210 defines a wall between the inner surface 230 and the central opening 202. The trench 210 may have a depth "T5" that is larger than the depth "T3" of the upper section 222. The depth "T5" may be smaller than the combination of depth "T3" and "T4". The depth "T5" may be about 0.4 inches to about 0.8 inches.

A notch or recess 234 may be formed on the inner surface 230 of the trench 210. The notch or recess 234 may be beveled so that a portion of the inner surface 230 extends along a direction with respect to a bottom surface 236 of the trench 210 at an angle "β" between about 15° and about 45°, for example about 30°. An inner edge 232, 233 of the trench 210 forming part of the first surface 204 may be rounded. Similarly, the bottom corners 238, 240 of the trench 210 may be rounded.

The trench 210 may have an inner diameter "D7" and an outer diameter "D8" that is greater than the inner diameter "D7". A portion of the inner surface 230 that is resided within the notch or recess 234 has a diameter "D9" that is smaller than the inner diameter "D7" of the trench 210. The diameter "D9" is relatively larger than the inner diameter "D4" of the upper section 222. The inner diameter "D7" may be about 2.6 inches to about 3.5 inches. The outer diameter "D8" may be about 4 inches to about 5.5 inches. The diameter "D9" may be about 2.2 inches to about 3.2 inches.

Figure 3A:
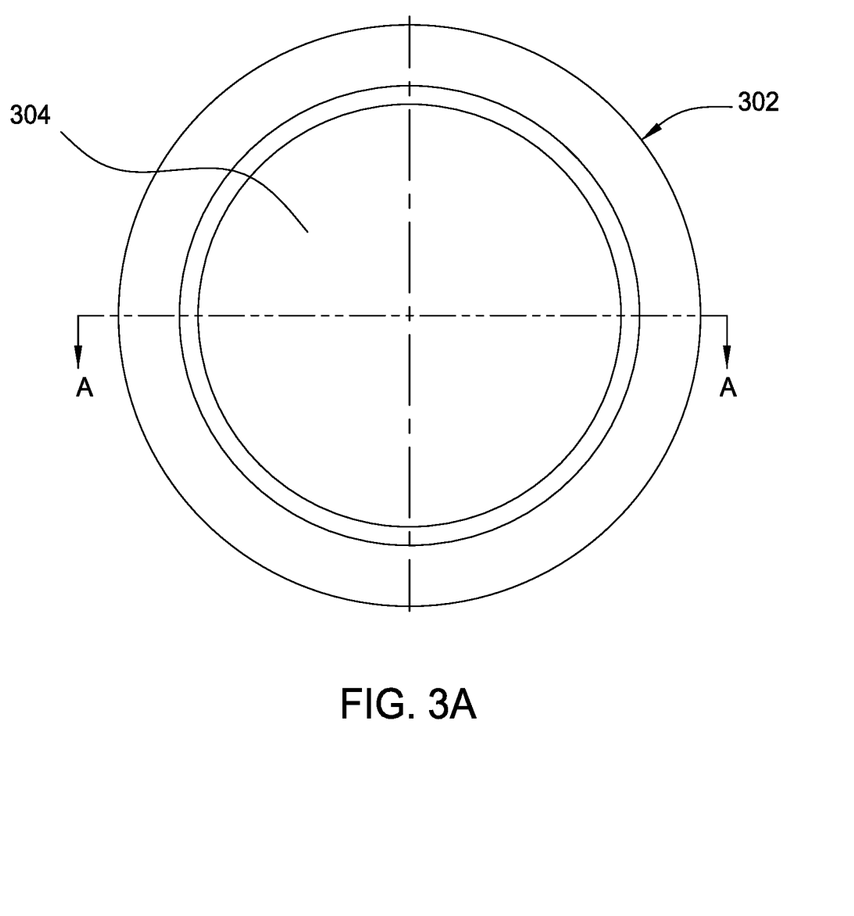
FIG. 3A depicts a top view of a spacer ring according to one implementation of the present disclosure.
Figure 3B:
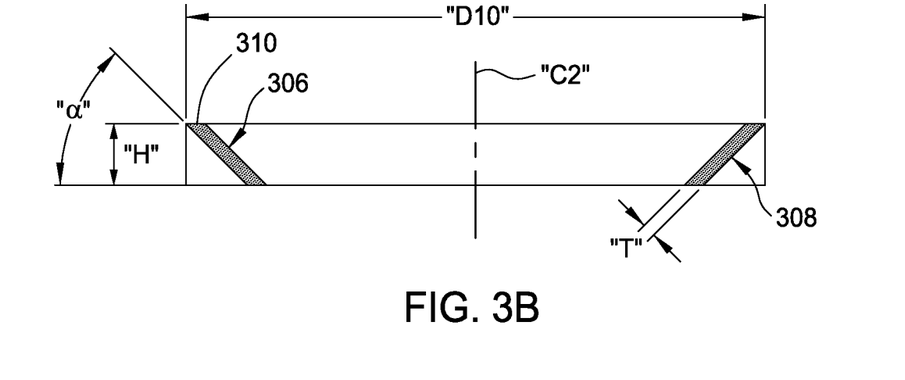
FIG. 3B depicts a schematic cross-sectional view of the spacer ring taken along line A-A of FIG. 3A.
Figure 3C:
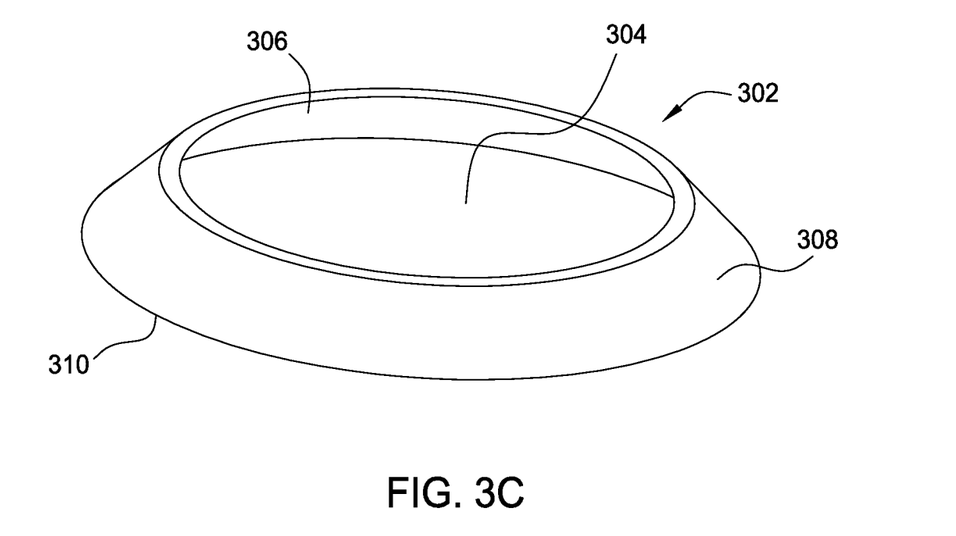
FIG. 3C depicts a prospective view of the spacer ring of FIG. 3A.

FIG. 3A depicts a top view of a spacer ring 302 according to one implementation of the present disclosure. FIG. 3B depicts a schematic cross-sectional view of the spacer ring 302 taken along line A-A of FIG. 3A. FIG. 3C depicts a prospective view of the spacer ring 302 of FIG. 3A. The spacer ring 302 may be removably disposed between the lid 108 and the gas coupling insert 114 depicted in FIG. 1. The spacer ring 302 keeps the ceramic coating that is applied onto exposed surface of the gas coupling insert 114 from robbing against the lid 108, which would otherwise generate particles that contaminates the processing chamber. As shown in FIG. 3A, the spacer ring 302 has a center opening 304 sized to allow passage of a portion of the gas coupling insert 114 (FIG. 1). The spacer ring 302 has a central axis "C2" vertically passing through the spacer ring 302. The spacer ring 302 is coaxial with the lid 208.

The inner surface 306 of spacer ring 302 substantially follows the contour of the profile of the upper section 222 (FIG. 2C). In one implementation, the spacer ring 302 has a generally hollow frusto-conical shape, as shown in FIG. 3C. The spacer ring 302 may be sized to rest on the upper section 222 of the lid 208 by gravity or any suitable mechanical manner. Once the spacer ring 302 has been disposed on the upper section 222 of the lid 208, the gas coupling insert 114 (FIG. 1) is then disposed on the spacer ring 302. Thereafter, the gas connector 156 (FIG. 1) is disposed on the lid 208 to secure the gas coupling insert 114 within the central opening 202 of the lid 208.

The outer surface 308 of the spacer ring 302 may be extended in a direction with respect to a top surface 310 of the spacer ring 302 at an angle "α". The angle "α" may be between about 30° to about 60°, for example about 45°. The spacer ring 302 may have a height "H", which is substantially corresponding to the depth "T3" of the upper section 222 depicted in FIG. 2C. The spacer ring 302 may have a thickness "T" of about 0.020 inches to about 0.1 inches, for example about 0.045 inches. The spacer ring 302 may have an outer diameter "D10," measuring from the edge of the top surface 310. The outer diameter "D10" may correspond to the inner diameter "D4" of the upper section 222 of the lid 208 depicted in FIG. 2C.

The space ring 302 may be made of polyimide, elastomer, or any other suitable material that has excellent mechanical characteristics and heat resistance.

Figure 4:
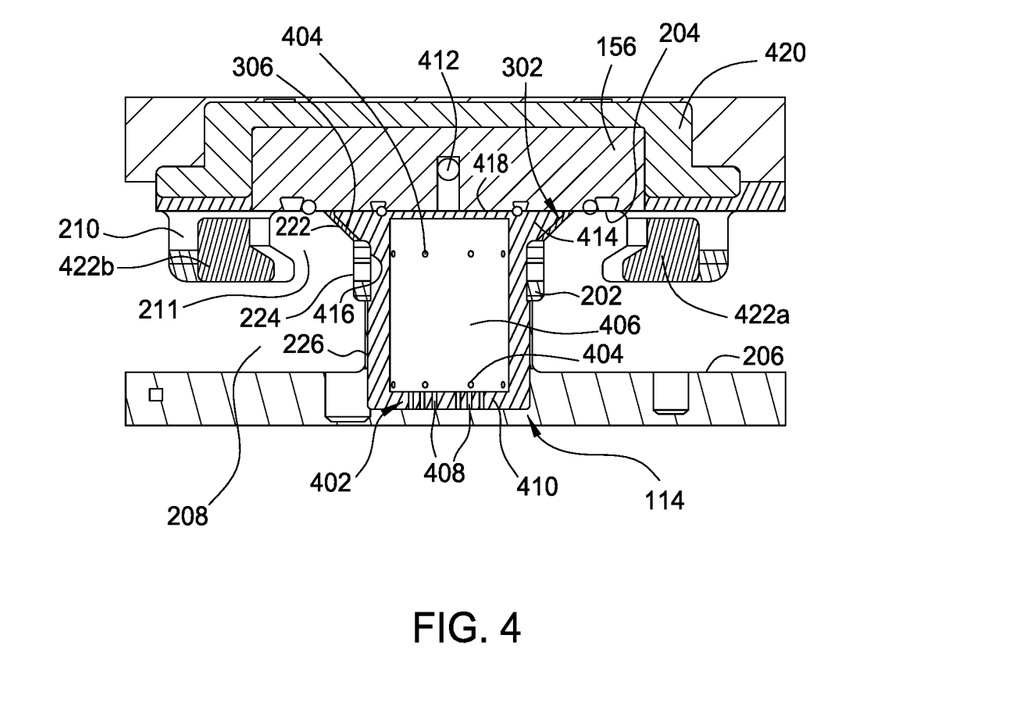
FIG. 4 is an enlarged cross-sectional view of FIG. 2C showing a gas coupling insert disposed within the central opening of the lid.

FIG. 4 is an enlarged cross-sectional view of FIG. 2C showing a gas coupling insert 114 disposed within the central opening 202 of the lid 208. The gas coupling insert 114 may be a cylindrical hollow body having a plurality of through holes 404 formed around the side wall 406 of the cylindrical hollow body. The gas coupling insert 114 may also have a plurality of axial through holes 408 formed in the bottom 410 of the cylindrical hollow body. The spacer ring 302 is inserted between the lid 208 and the gas coupling insert 114.

The gas coupling insert 114 may have a conical or tapered flange 414 extending outwardly from an outer surface 416 of the cylindrical hollow body. The conical or tapered flange 414 may be disposed around an upper end of the gas coupling insert 114. The conical or tapered flange 414 substantially follows the contour of the profile of the upper section 222. A ceramic coating, such as the ceramic coating 214 discussed above, may be deposited onto the exposed surface of the conical or tapered flange 414.

Once the gas coupling insert 114 is disposed within the central opening 202 of the lid 208, the conical or tapered flange 414 is rest on the inner surface 306 of the spacer ring 302 by gravity or any suitable mechanical manner, leaving the rest of the cylindrical hollow body stuck out of the bottom of the spacer ring 302. The portion of the cylindrical hollow body below the conical or tapered flange 414 extends through the middle section 224 and the bottom section 226 to a distance below the second surface 206 of the lid 208.

A gas connector 156 is disposed on the lid 208. The gas connector 156 radially covers the upper surface 418 of gas coupling insert 114 and a portion of the first surface 204 without fully covering the trench 210. The trench 210, as discussed above with respect to FIGS. 2B and 2C, is shaped to provide a flange 211 around the upper section 222 of the central opening 202. The trench 210 receives a pair of lower flanges 422a, 422b. Particularly, the trench 210 uses the flange 211 to secure an upper flange 420 and the pair of lower flanges 422a, 422b. The upper flange 420 and the pair of lower flanges 422a, 422b may be coupled together via screws or any other suitable mechanical means. The upper flange 420 is shaped to house the gas connector 156. The upper clamp 420 and the lower clamps 422a, 422b therefore secure the gas connector 156 and the gas coupling insert 114 in place with respective to the lid 208 through the use of the flange 211. During processing, the low pressure in the processing chamber will suck down the gas connector 156 to further hold these parts in place. A processing source gas (not shown) is introduced into the gas connector 156 through a gas inlet 412 and then to the cylindrical hollow body. The processing gas flows through the through holes 404 and the axial through holes 408 of the gas coupling insert 114, thereby providing uniform controlled gas flow distribution in the processing volume 110 (FIG. 1).

In summary, implementations of the present disclosure provide an improved lid for use in a semiconductor processing system. The conical or tapered flange 414 of the gas coupling insert 114 and the corresponding flared-out profile of the upper section of the lid 208 allow smooth contact between the gas coupling insert 114 and the lid 208. Since no hard angle is presented within the central opening 202 of the lid 208, any undesired chipping and cracking of the gas coupling insert 114 and/or lid 208 during maintenance, installation, or removal of the gas coupling insert 114 is minimized or avoided. A spacer ring made of polyimide is disposed between the chamber lid and the gas feed insert to keep the ceramic coating on the gas feed insert from robbing against the chamber lid. As a result, particles generation at the interface between the gas coupling insert 114 and the lid 208 is also greatly reduced since the contact surface between the conical or tapered flange 414 and the lid 208, which is believed to be a source of particle contamination, is cushioned by the spacer ring 302.

While the foregoing is directed to implementations of the present disclosure, other and further implementations of the disclosure may be devised without departing from the basic scope thereof, and the scope thereof is determined by the claims that follow.

What is claimed is:

1. A lid for a substrate processing chamber, comprising: a cover member consisting of a single plate and having a first surface and a second surface opposite the first surface; a coating disposed on the second surface, wherein the coating comprises yttrium oxide and at least one of zirconium oxide, aluminum oxide, or a combination thereof; a central opening in the cover member, wherein an inner profile of the central opening comprises a first section having a first diameter, a second section having a second diameter, and a third section having a third diameter, wherein: the second section is disposed between and connected to the first section and the third section; the first diameter gradually increases from the second section toward the first surface of the cover member; and the third diameter is less than the second diameter; and a trench surrounding the central opening, the trench formed along a closed path in the first surface of the cover member, the trench providing a recess formed in an inner surface of the trench.

2. The lid of claim 1, wherein the first section has an inner surface that is angled with respect to a central axis of the central opening.

3. The lid of claim 2, wherein the angle of the inner surface of the first section is between about 30° and about 60°.

4. The lid of claim 1, wherein the recess has a bevel extending along a direction with respect to a bottom surface of the trench at an angle of between about 15° and about 45°.

5. The lid of claim 1, wherein the second diameter cylindrically extends from the first section to the third section.

6. The lid of claim 1, wherein the third section has a rounded corner extending to the second surface of the cover member, and the third diameter cylindrically extends from the second section to the rounded corner.

7. The lid of claim 6, wherein the second surface of the cover member has an average surface roughness of between about 2 Angstroms and about 150 Angstroms.

8. The lid of claim 1, wherein the cover member is made of quartz or sapphire.

9. The lid of claim 1, wherein the coating has a thickness of about 0.001 inches to about 0.100 inches.

10. The lid of claim 1, wherein the cover member is made of a non-flame polished quartz.

11. The lid of claim 1, wherein the coating has a thickness of about 0.005 inches to about 0.050 inches.

12. The lid of claim 1, wherein the coating disposed on the second surface comprises yttrium oxide, zirconium oxide, and aluminum oxide.

13. The lid of claim 12, wherein the coating comprises about 40 mol.% to about 85 mol.% of the yttrium oxide, about 5 mol.% to about 60 mol.% of the zirconium oxide, and about 5 mol.% to about 50 mol.% of the aluminum oxide.

14. The lid of claim 12, wherein the coating comprises about 50 mol.% to about 75 mol.% of the yttrium oxide, about 10 mol.% to about 30 mol.% of the zirconium oxide, and about 10 mol.% to about 30 mol.% of the aluminum oxide.

15. The lid of claim 12, wherein the coating comprises about 55 mol.% to about 65 mol.% of the yttrium oxide, about 10 mol.% to about 25 mol.% of the zirconium oxide, and about 10 mol.% to about 20 mol.% of the aluminum oxide.

16. The lid of claim 12, wherein the coating comprises about 55 mol.% to about 65 mol.% of the yttrium oxide, about 20 mol.% to about 25 mol.% of the zirconium oxide, and about 5 mol.% to about 10 mol.% of the aluminum oxide.

17. The lid of claim 1, wherein the coating disposed on the second surface comprises yttrium oxide and aluminum oxide.

18. The lid of claim 17, wherein the coating comprises about 30 mol.% to about 60 mol.% of the yttrium oxide and about 30 mol.% to about 60 mol.% of the aluminum oxide.

19. The lid of claim 1, wherein the coating disposed on the second surface comprises yttrium oxide and zirconium oxide.

20. The lid of claim 1, wherein the coating disposed on the second surface comprises a ceramic material comprising a compound having a formula of $Y_4Al_2O_9$ and a solid solution of $Y_2O_3$ and $ZrO_2$.

* * * * *